United States Patent
Kusunoki et al.

(10) Patent No.: US 11,961,871 B2
(45) Date of Patent: Apr. 16, 2024

(54) DISPLAY DEVICE, DISPLAY MODULE, ELECTRONIC DEVICE, AND METHOD FOR FABRICATING DISPLAY DEVICE

(71) Applicant: SEMICONDUCTOR ENERGY LABORATORY CO., LTD., Atsugi (JP)

(72) Inventors: Koji Kusunoki, Kanagawa (JP); Shingo Eguchi, Kanagawa (JP); Yosuke Tsukamoto, Kanagawa (JP); Kazunori Watanabe, Tokyo (JP); Kouhei Toyotaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 445 days.

(21) Appl. No.: 17/055,383

(22) PCT Filed: Apr. 26, 2019

(86) PCT No.: PCT/IB2019/053436
§ 371 (c)(1),
(2) Date: Nov. 13, 2020

(87) PCT Pub. No.: WO2019/220246
PCT Pub. Date: Nov. 21, 2019

(65) Prior Publication Data
US 2021/0217805 A1     Jul. 15, 2021

(30) Foreign Application Priority Data

May 18, 2018   (JP) ................................ 2018-095872

(51) Int. Cl.
*H01L 27/15*    (2006.01)
*H01L 33/00*    (2010.01)
*H01L 33/62*    (2010.01)

(52) U.S. Cl.
CPC .......... *H01L 27/156* (2013.01); *H01L 33/005* (2013.01); *H01L 33/62* (2013.01); *H01L 2933/0066* (2013.01)

(58) Field of Classification Search
CPC ..... H01L 27/156; H01L 33/005; H01L 33/62; H01L 2933/0066; H01L 27/1225;
(Continued)

(56) References Cited

U.S. PATENT DOCUMENTS 9,887,184 B2   2/2018 Takeya et al.
10,269,779 B2  4/2019 Lu
(Continued)

FOREIGN PATENT DOCUMENTS

CN    101847646 A    9/2010
CN    107170773 A    9/2017
(Continued)

OTHER PUBLICATIONS

Chinese Office Action (Application No. 201980031381.0) dated Jun. 1, 2022.
(Continued)

*Primary Examiner* — Victor A Mandala
(74) *Attorney, Agent, or Firm* — Fish & Richardson P.C.

(57) ABSTRACT

A display device with high resolution is provided. Manufacturing cost of a display device using a micro LED as a display element is reduced. The display device includes a substrate, a plurality of transistors, and a plurality of light-emitting diodes. The plurality of light-emitting diodes are provided in a matrix over the substrate. Each of the plurality of transistors are electrically connected to at least one of the plurality of light-emitting diodes. The plurality of light-emitting diodes are positioned closer to the substrate than the plurality of transistors are. The plurality of light-emitting diodes emit light to the opposite side of the substrate.

14 Claims, 11 Drawing Sheets

(58) Field of Classification Search
CPC . H01L 21/7806; H01L 33/44; H01L 25/0753; H01L 27/124; H01L 27/1266; H01L 25/167; G09F 9/33; B81B 7/02; B81C 3/00
See application file for complete search history.

(56) References Cited

U.S. PATENT DOCUMENTS

| | | | |
|---|---|---|---|
| 10,312,225 B2 | 6/2019 | Takeya et al. | |
| 10,424,569 B2 | 9/2019 | Lu | |
| 10,833,057 B2 | 11/2020 | Takeya et al. | |
| 2014/0367705 A1 | 12/2014 | Bibl et al. | |
| 2017/0168333 A1 | 6/2017 | Kubota et al. | |
| 2017/0170373 A1 | 6/2017 | Peng et al. | |
| 2017/0221935 A1* | 8/2017 | Liu | H01L 29/78693 |
| 2017/0373036 A1* | 12/2017 | Yamazaki | H10K 59/35 |
| 2018/0095559 A1* | 4/2018 | Yamazaki | G02F 1/133553 |
| 2018/0122836 A1* | 5/2018 | Kang | H01L 33/60 |
| 2018/0122837 A1* | 5/2018 | Kang | H01L 27/124 |
| 2018/0188606 A1* | 7/2018 | Lee | G02F 1/133608 |
| 2018/0269234 A1* | 9/2018 | Hughes | H01L 27/156 |
| 2018/0294314 A1* | 10/2018 | Liu | H01L 27/1251 |
| 2019/0027075 A1* | 1/2019 | Hughes | H01L 25/0753 |
| 2019/0081076 A1* | 3/2019 | Okada | H01L 27/124 |
| 2019/0265532 A1* | 8/2019 | Yamazaki | G06F 3/04166 |
| 2020/0328198 A1 | 10/2020 | Takeya et al. | |
| 2022/0157797 A1 | 5/2022 | Takeya et al. | |

FOREIGN PATENT DOCUMENTS

| | | |
|---|---|---|
| CN | 107852794 A | 3/2018 |
| CN | 108022940 A | 5/2018 |
| EP | 3316301 A | 5/2018 |
| EP | 3328162 A | 5/2018 |
| EP | 3640990 A | 4/2020 |
| EP | 3790361 A | 3/2021 |
| JP | 2012-104566 A | 5/2012 |
| JP | 2017-111438 A | 6/2017 |
| JP | 2018-060184 A | 4/2018 |
| KR | 2018-0046494 A | 5/2018 |
| KR | 2018-0093000 A | 8/2018 |
| WO | WO-2017/098376 | 6/2017 |

OTHER PUBLICATIONS

International Search Report (Application No. PCT/IB2019/053436) dated Jul. 30, 2019.
Written Opinion (Application No. PCT/IB2019/053436) dated Jul. 30, 2019.

* cited by examiner

DISPLAY DEVICE, DISPLAY MODULE, ELECTRONIC DEVICE, AND METHOD FOR FABRICATING DISPLAY DEVICE

CROSS REFERENCE TO RELATED APPLICATIONS

This application is a U.S. National Phase Application under 35 U.S.C. § 371 of International Application PCT/IB2019/053436, filed on Apr. 26, 2019, which is incorporated by reference and claims the benefit of a foreign priority application filed in Japan on May 18, 2018, as Application No. 2018-095872.

TECHNICAL FIELD

One embodiment of the present invention relates to a display device, a display module, an electronic device, and a fabricating method thereof.

Note that one embodiment of the present invention is not limited to the above-described technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, or a manufacturing method thereof.

BACKGROUND ART

In recent years, a display device using a micro light-emitting diode (a micro LED (Light Emitting Diode)) as a display element has been proposed (e.g., Patent Document 1). The display device using a micro LED as a display element has advantages of high luminance, high contrast, a long lifetime, and the like, and has been actively developed as a next-generation display device.

REFERENCE

Patent Document

[Patent Document 1] Specification of United States Patent Application Publication No. 2014/0367705

SUMMARY OF THE INVENTION

Problems to be Solved by the Invention

The time taken for mounting an LED chip on a display device using a micro LED as a display element is extremely long, so that manufacturing cost reduction is needed. In a pick-and-place method, for example, red (R), green (G), and blue (B) LEDs are fabricated on respective wafers, and the LEDs are cut out one by one and mounted on a circuit board. Therefore, as the number of pixels of the display device increases, the number of LEDs to be mounted increases, and thus the time taken for mounting becomes longer. Moreover, as the resolution of the display device becomes higher, it becomes more difficult to mount LEDs.

An object of one embodiment of the present invention is to provide a display device with high resolution. An object of one embodiment of the present invention is to provide a display device with high display quality. An object of one embodiment of the present invention is to reduce the thickness and weight of a display device.

An object of one embodiment of the present invention is to reduce manufacturing cost of a display device using a micro LED as a display element. An object of one embodiment of the present invention is to manufacture a display device using a micro LED as a display element with a high yield.

Note that the descriptions of these objects do not disturb the existence of other objects. One embodiment of the present invention does not need to achieve all the objects. Other objects can be derived from the descriptions of the specification, the drawings, and the claims.

Means for Solving the Problems

A display device of one embodiment of the present invention includes a substrate, a plurality of transistors, and a plurality of light-emitting diodes. The plurality of light-emitting diodes are provided in a matrix over the substrate. Each of the plurality of transistors is electrically connected to at least one of the plurality of light-emitting diodes. The plurality of light-emitting diodes are positioned closer to the substrate than the plurality of transistors are. The plurality of light-emitting diodes emit light to the opposite side of the substrate.

At least one of the plurality of light-emitting diodes is preferably a micro light-emitting diode.

At least one of the plurality of transistors preferably includes a metal oxide in a channel formation region.

The plurality of light-emitting diodes preferably include a first light-emitting diode and a second light-emitting diode, which emit light of different colors. Alternatively, the plurality of light-emitting diodes preferably emit white light.

At least one of the plurality of transistors preferably includes a semiconductor layer transmitting visible light. The semiconductor layer includes a channel formation region and a pair of low-resistance regions. The pair of low-resistance regions has a lower resistance than the channel formation region. Light emitted from the light-emitting diode is transmitted through at least one of the pair of low-resistance regions and emitted to the substrate side.

One embodiment of the present invention is a module including a display device with the above-described structure, such as a module to which a connector such as a Flexible printed circuit (hereinafter referred to as FPC) or a TCP (Tape Carrier Package) is attached or a module on which an integrated circuit (IC) is mounted by a COG (Chip On Glass) method, a COF (Chip On Film) method, or the like.

One embodiment of the present invention is an electronic device including the above-described module and at least one of an antenna, a battery, a housing, a camera, a speaker, a microphone, and an operation button.

One embodiment of the present invention is a method for fabricating a display device, including: forming a plurality of transistors in a matrix over a first substrate; forming a plurality of light-emitting diodes in a matrix over a second substrate; forming a first conductor electrically connected to at least one of the plurality of transistors or at least one of the plurality of light-emitting diodes over the first substrate or the second substrate; and attaching the first substrate and the second substrate to each other so that at least one of the plurality of transistors and at least one of the plurality of light-emitting diodes are electrically connected to each other through the first conductor.

It is preferable that the first conductor be formed over the first substrate to electrically connect the first conductor and at least one of the plurality of transistors to each other, a second conductor connected to at least one of the plurality of light-emitting diodes be formed over the second substrate, and the first substrate and the second substrate be attached to each other so that the first conductor and the second conductor are in contact with each other.

After the first substrate and the second substrate are attached to each other, the first substrate may be separated.

One embodiment of the present invention is a method for fabricating a display device, including: forming a separation layer over a first substrate; forming an insulating layer over the separation layer; forming an opening in part of the insulating layer; forming a plurality of transistors in a matrix over the insulating layer; forming a conductive layer over the separation layer to overlap with the opening in the insulating layer; sealing the plurality of transistors; separating the first substrate with the use of the separation layer to expose the conductive layer on the separation layer side; forming a plurality of light-emitting diodes over a second substrate; and transferring the plurality of transistors to the second substrate so that at least one of the plurality of transistors and at least one of the plurality of light-emitting diodes are electrically connected to each other through the conductive layer. The conductive layer is electrically connected to at least one of the plurality of transistors or functions as a source or a drain of at least of the plurality of transistors.

One embodiment of the present invention is a method for fabricating a display device, including: forming a separation layer over a first substrate; forming an insulating layer over the separation layer; forming an opening in part of the insulating layer; forming a plurality of transistors in a matrix over the insulating layer; and sealing the plurality of transistors. A semiconductor layer of each of the plurality of transistors includes a channel formation region and a pair of low-resistance regions, the channel formation region is formed over the insulating layer, and one of the pair of low-resistance regions is formed over the separation layer to overlap with the opening in the insulating layer. The method also includes: separating the first substrate with the use of the separation layer to expose the one of the pair of low-resistance regions on the separation layer side; forming a plurality of light-emitting diodes in a matrix over a second substrate; and transferring the plurality of transistors to the second substrate so that at least one of the plurality of transistors and at least one of the plurality of light-emitting diodes are electrically connected to each other through the one of the pair of low-resistance regions.

Effect of the Invention

According to one embodiment of the present invention, a display device with high resolution can be provided. According to one embodiment of the present invention, a display device with high display quality can be provided. According to one embodiment of the present invention, reduction in thickness or weight of a display device becomes possible.

According to one embodiment of the present invention, manufacturing cost of a display device using a micro LED as a display element can be reduced. According to one embodiment of the present invention, a display device using a micro LED as a display element can be manufactured with a high yield.

Note that the descriptions of these effects do not disturb the existence of other effects. One embodiment of the present invention does not need to have all the effects. Other effects can be derived from the descriptions of the specification, the drawings, and the claims.

BRIEF DESCRIPTION OF THE DRAWINGS

FIG. 1 FIG. 1(A) is a cross-sectional view illustrating a structure example of a display device.

FIG. 2 FIG. 2(A) is a cross-sectional view illustrating a structure example of a display device.

FIG. 3 FIG. 3(A) is a cross-sectional view illustrating a structure example of a display device.

FIG. 4 FIG. 4(A) is a cross-sectional view illustrating a structure example of a display device.

FIG. 5 FIG. 5(A) and FIG. 5(B) are cross-sectional views illustrating an example of a method for fabricating a circuit array.

FIG. 8 FIG. 8(A) and FIG. 8(B) are cross-sectional views each illustrating a structure example of a transistor.

FIG. 9 FIG. 9(A) to FIG. 9(D) are diagrams each illustrating an example of an electronic device.

FIG. 10 FIG. 10(A) to FIG. 10(E) are diagrams illustrating examples of an electronic device.

FIG. 11 FIG. 11(A) to FIG. 11(F) are diagrams illustrating examples of an electronic device.

MODE FOR CARRYING OUT THE INVENTION

Figure 1A:
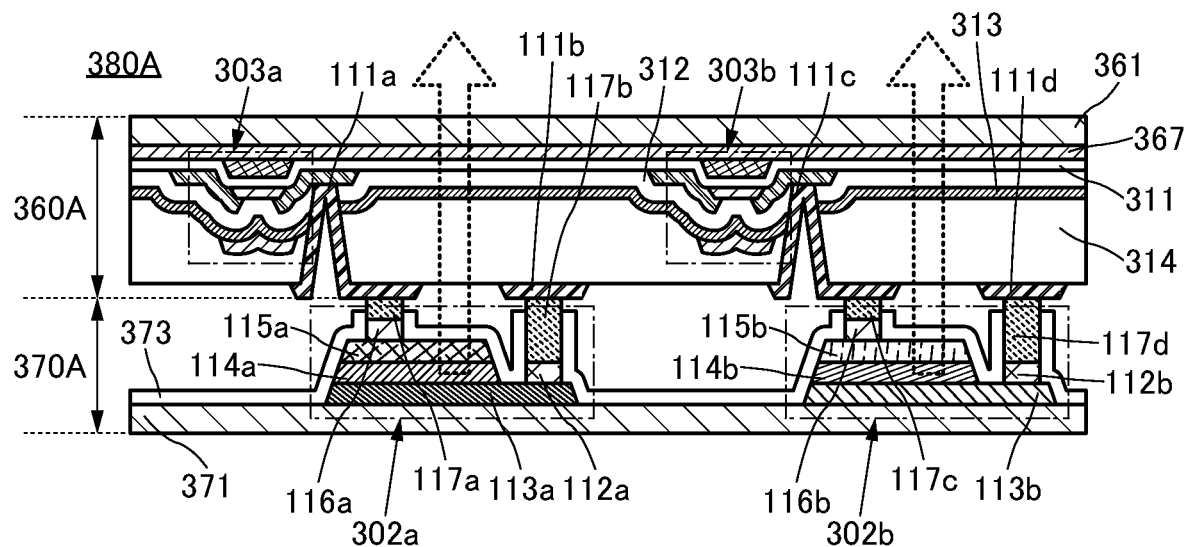

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and repeated description thereof is omitted. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer"

can be changed into the term "conductive film". As another example, the term "insulating film" can be changed into the term "insulating layer".

Embodiment 1

In this embodiment, display devices of embodiments of the present invention are described with reference to FIG. 1 to FIG. 8.

[Summary of Display Device]

The display device of this embodiment includes a plurality of light-emitting diodes that are display elements, and a plurality of transistors for driving the display elements. The plurality of light-emitting diodes are provided in a matrix over a substrate. Each of the plurality of transistors is electrically connected to at least one of the plurality of light-emitting diodes. The plurality of light-emitting diodes are positioned closer to the substrate than the plurality of transistors are. The plurality of light-emitting diodes emit light to the opposite side of the substrate.

The display device of this embodiment is formed by attaching the plurality of transistors and the plurality of light-emitting diodes to each other, which are formed over different substrates.

In a method for fabricating the display device of this embodiment, the plurality of light-emitting diodes and the plurality of transistors are attached to each other at a time; thus, even in the case of fabricating a display device with a large number of pixels or a display device with high resolution, the manufacturing time for the display device can be shortened and manufacturing difficulty can be lowered, compared to a method in which light-emitting diodes are mounted on a circuit board one by one.

The display device of this embodiment has a function of displaying an image with the use of the light-emitting diode. In this embodiment, in particular, an example where a micro LED is used as the light-emitting diode is described. Note that in this embodiment, a micro LED having a double heterojunction is described. Note that there is no particular limitation on the light-emitting diode, and for example, a micro LED having a quantum well junction or a nanocolumn LED may be used.

When a micro LED is used as the display element, the power consumption of the display device can be reduced. Furthermore, the display device can be thinner and more lightweight. Moreover, the display device using the micro LED as the display element have high contrast and a wide viewing angle; thus, the display quality can be improved.

The area of a light-emitting region of the light-emitting diode is preferably less than or equal to 1 mm$^2$, further preferably less than or equal to 10000 µm$^2$, still further preferably less than or equal to 3000 µm$^2$, even further preferably less than or equal to 700 µm$^2$. Note that in this specification and the like, a light-emitting diode with a light-emitting region whose area is less than or equal to 10000 µm$^2$ is referred to as a micro LED in some cases.

The transistor included in the display device preferably includes a metal oxide in its channel formation region. The transistor using a metal oxide can have low power consumption. Thus, a combination with a micro LED can achieve a display device with significantly reduced power consumption.

[Structure Example A of Display Device]

FIG. 1(A) illustrates a cross-sectional view of a display device 380A.

The display device 380A has a structure in which a circuit board 360A and an LED substrate 370A are attached to each other.

Figure 1B:
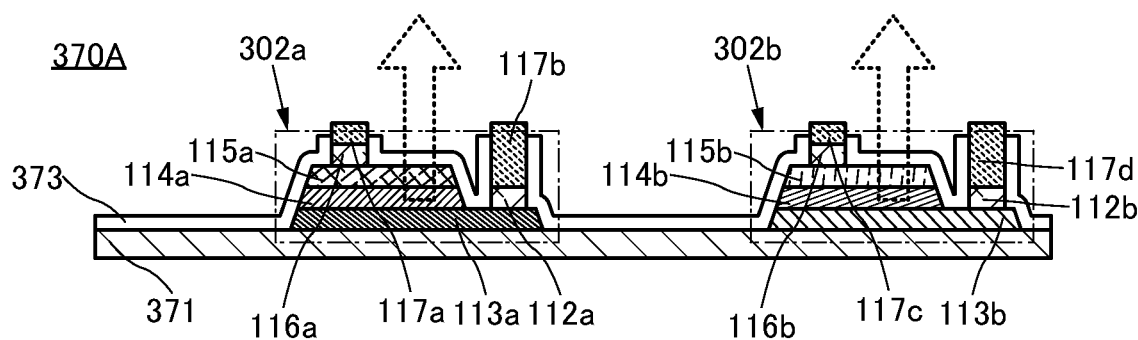
FIG. 1(B) is a cross-sectional view illustrating a structure example of an LED substrate.

FIG. 1(B) illustrates a cross-sectional view of the LED substrate 370A.

The LED substrate 370A includes a substrate 371, a light-emitting diode 302a, a light-emitting diode 302b, a conductor 117a, a conductor 117b, a conductor 117c, a conductor 117d, and a protective layer 373.

The light-emitting diode 302a includes an electrode 112a, a semiconductor layer 113a, a light-emitting layer 114a, a semiconductor layer 115a, and an electrode 116a. The light-emitting diode 302b includes an electrode 112b, a semiconductor layer 113b, a light-emitting layer 114b, a semiconductor layer 115b, and an electrode 116b.

The electrode 112a is electrically connected to the semiconductor layer 113a and the conductor 117b. The electrode 116a is electrically connected to the semiconductor layer 115a and the conductor 117a. The electrode 112b is electrically connected to the semiconductor layer 113b and the conductor 117d. The electrode 116b is electrically connected to the semiconductor layer 115b and the conductor 117c. The protective layer 373 is provided to cover the substrate 371, the electrodes 112a and 112b, the semiconductor layers 113a and 113b, the light-emitting layers 114a and 114b, the semiconductor layers 115a and 115b, and the electrodes 116a and 116b. The protective layer 373 covers the side surfaces of the conductors 117a to 117d and includes openings overlapping with the top surfaces of the conductors 117a to 117d. In the openings, the top surfaces of the conductors 117a to 117d are exposed.

The light-emitting layer 114a is sandwiched between the semiconductor layer 113a and the semiconductor layer 115a. The light-emitting layer 114b is sandwiched between the semiconductor layer 113b and the semiconductor layer 115b. In the light-emitting layers 114a and 114b, electrons and holes are combined to emit light. Either the semiconductor layers 113a and 113b or the semiconductor layers 115a and 115b are n-type semiconductor layers, and the others are p-type semiconductor layers. A stacked-layer structure including the semiconductor layer 113a, the light-emitting layer 114a, and the semiconductor layer 115a and a stacked-layer structure including the semiconductor layer 113b, the light-emitting layer 114b, and the semiconductor layer 115b are each formed to emit light of red, yellow, green, blue, or the like. It is preferable that the two stacked-layer structures emit light of different colors. For these stacked-layer structures, a compound of gallium and phosphorus; a compound of gallium and arsenic; a compound of gallium, aluminum, and arsenic; a compound of aluminum, gallium, indium, and phosphorus; gallium nitride; a compound of indium and gallium nitride; a compound of selenium and zinc; or the like can be used, for example. When the stacked-layer structure including the semiconductor layer 113a, the light-emitting layer 114a, and the semiconductor layer 115a is formed to emit light of red, yellow, green, blue, or the like as described above, a step of forming a coloring film such as a color filter is not necessary. Consequently, the manufacturing cost of the display device can be reduced. The two stacked-layer structures may emit light of the same color. In this case, light emitted from the light-emitting layers 114a and 114b may be extracted to the outside of the display device through a coloring film.

As the substrate 371, for example, a single crystal substrate such as a sapphire ($Al_2O_3$) substrate, a silicon carbide (SiC) substrate, a silicon (Si) substrate, a gallium nitride (GaN) substrate, or the like can be used.

Figure 1C:
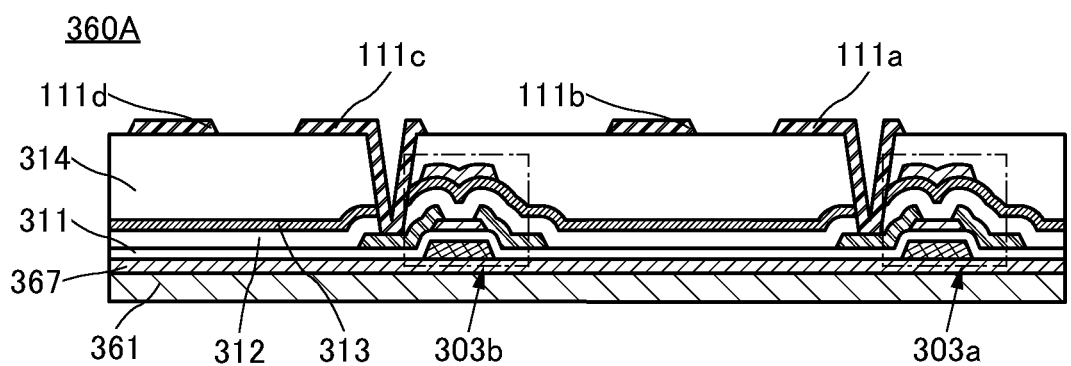
FIG. 1(C) is a cross-sectional view illustrating a structure example of a circuit board.

FIG. 1(C) illustrates a cross-sectional view of a circuit board 360A.

The circuit board 360A includes a substrate 361, an insulating layer 367, a transistor 303a, a transistor 303b, an insulating layer 314, a conductive layer 111a, a conductive layer 111b, a conductive layer 111c, and a conductive layer 111d.

Each of the transistors 303a and 303b includes a gate, a gate insulating layer 311, a semiconductor layer, a back gate, a source, and a drain. The gate (the lower gate) and the semiconductor layer overlap with each other with the gate insulating layer 311 therebetween. The back gate (the upper gate) and the semiconductor layer overlap with each other with an insulating layer 312 and an insulating layer 313 therebetween. The semiconductor layer preferably includes an oxide semiconductor.

A material through which impurities such as water or hydrogen do not easily diffuse is preferably used for at least one of the insulating layer 312, the insulating layer 313, and the insulating layer 314. Diffusion of impurities from the outside into the transistors can be effectively inhibited, leading to improved reliability of the display device. The insulating layer 314 has a function of a planarization layer.

The insulating layer 367 has a function of a base film. For the insulating layer 367, a material through which impurities such as water or hydrogen do not easily diffuse is preferably used.

As illustrated in FIG. 1(A), the conductor 117a provided in the LED substrate 370A is connected to the conductive layer 111a provided in the circuit board 360A. Thus, the transistor 303a and the light-emitting diode 302a can be electrically connected to each other. The electrode 116a functions as a pixel electrode of the light-emitting diode 302a. Furthermore, the conductor 117b provided in the LED substrate 370A and the conductive layer 111b provided in the circuit board 360A are connected to each other. The electrode 112a functions as a common electrode of the light-emitting diode 302a.

In a similar manner, the conductor 117c provided in the LED substrate 370A is connected to the conductive layer 111c provided in the circuit board 360A. Thus, the transistor 303b and the light-emitting diode 302b can be electrically connected to each other. The electrode 116b functions as a pixel electrode of the light-emitting diode 302b. Furthermore, the conductor 117d provided in the LED substrate 370A and the conductive layer 111d provided in the circuit board 360A are connected to each other. The electrode 112b functions as a common electrode of the light-emitting diode 302b.

Light emitted from the light-emitting diodes 302a and 302b is extracted to the substrate 361 side. The substrate 361, the insulating layer 367, the gate insulating layer 311, the insulating layers 312, 313, and 314, and the protective layer 373 each transmit the light.

Note that in this embodiment, an example where the light emitted from the light-emitting diodes is extracted to the opposite side of the substrate 371 is shown; however, in the case where the substrate 371 transmits visible light, the light may be extracted to the substrate 371 side. Alternatively, a reflective layer that reflects light emitted from the light-emitting diodes or a light-blocking layer that blocks the light may be provided on the side to which light emitted from the light-emitting diodes is not extracted.

For the conductors 117a to 117d, for example, a conductive paste of silver, carbon, copper, or the like or a bump of gold, solder, or the like can be favorably used. Furthermore, for the electrodes 112a, 112b, 116a, and 116b and the conductive layers 111a to 111d, each of which is connected to any of the conductors 117a to 117d, a conductive material having a low contact resistance with the conductors 117a to 117d is preferably used. In the case where a silver paste is used for the conductors 117a to 117d, for example, a conductive material connected to these conductors is preferably aluminum, titanium, copper, an alloy containing silver (Ag), palladium (Pd), and copper (Cu) (Ag—Pd—Cu (APC)), or the like because they have a low contact resistance.

Note that the conductors 117a to 117d may be provided not in the LED substrate 370A but in the circuit board 360A.

[Structure Example B of Display Device]

Figure 2A:
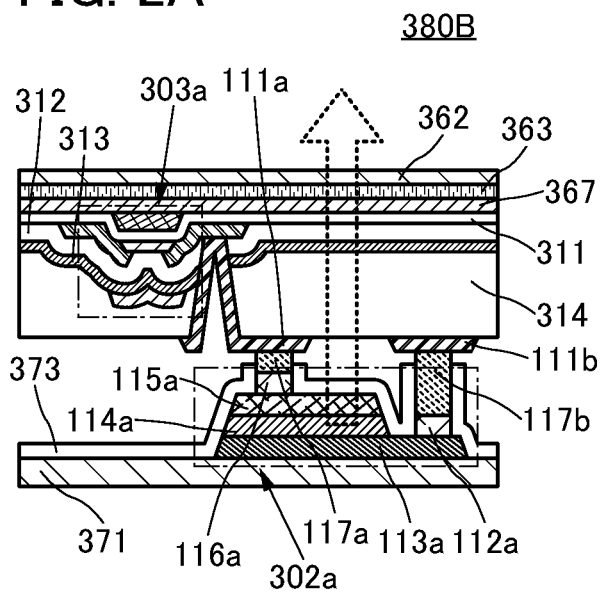

A display device 380B illustrated in FIG. 2(A) is different from the display device 380A in that the substrate 361 is not included and a flexible substrate 362 and an adhesive layer 363 are included.

A transistor is formed over a substrate having high heat resistance such as a glass substrate, whereby a transistor with high electrical characteristics and reliability can be formed. Then, the transistor is separated from the substrate and transferred to a flexible substrate such as a film, whereby a thinner and more lightweight display device can be achieved.

A method for fabricating the display device 380B is described with reference to FIG. 2(B) to FIG. 2(D).

Figure 2B:
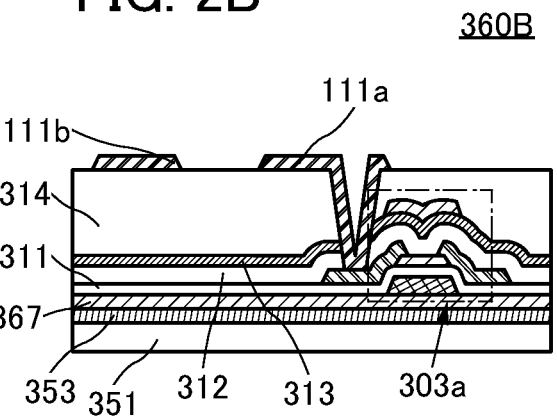
FIG. 2(B), FIG. 2(C), and FIG. 2(D) are cross-sectional views illustrating an example of a method for fabricating the display device.

As illustrated in FIG. 2(B), a separation layer 353 is formed over a substrate 351, and the insulating layer 367 is formed over the separation layer 353. Then, the transistor 303a, the insulating layer 314, and the conductive layers 111a and 111b are formed over the insulating layer 367. Thus, a circuit board 360B can be formed.

Figure 2C:
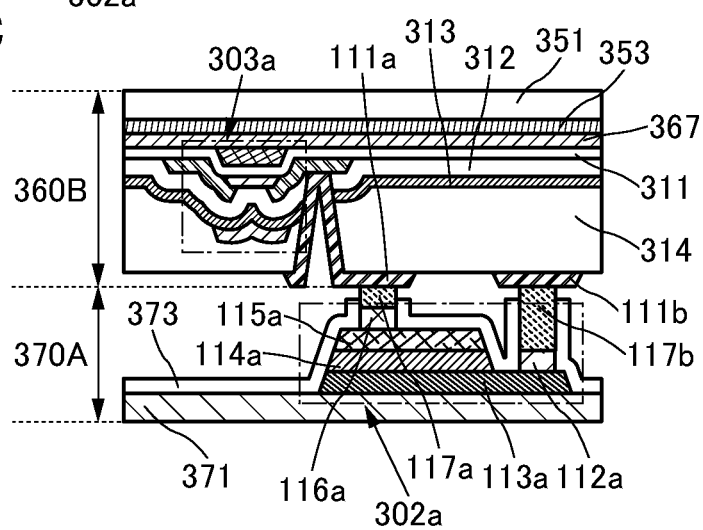

Next, as illustrated in FIG. 2(C), the circuit board 360B and the LED substrate 370A are attached to each other.

Figure 2D:
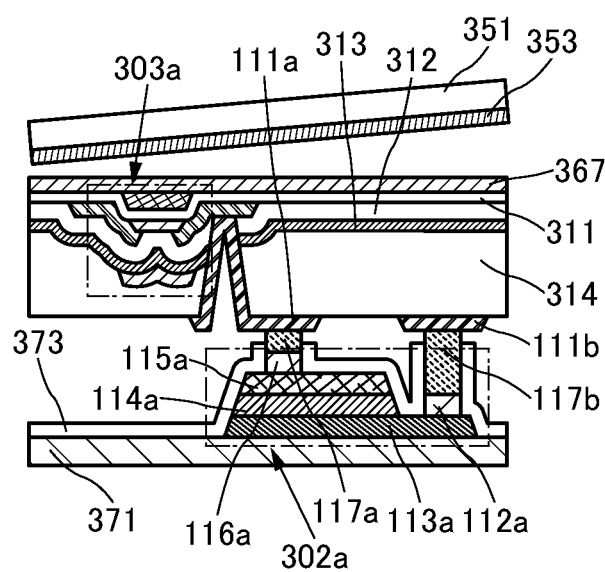

Then, as illustrated in FIG. 2(D), the substrate 351 is separated with the use of the separation layer 353. After that, the flexible substrate 362 is attached to the exposed insulating layer 367 with the use of the adhesive layer 363, whereby the display device 380B illustrated in FIG. 2(A) can be fabricated.

The substrate 351 has stiffness high enough for easy transfer and has heat resistance to temperature applied during the fabricating process. Examples of a material that can be used for the substrate 351 include glass, quartz, ceramic, sapphire, resin, a semiconductor, metal, and an alloy. Examples of the glass include alkali-free glass, barium borosilicate glass, and aluminoborosilicate glass.

The separation layer 353 can be formed using an organic material or an inorganic material.

Examples of the organic material that can be used for the separation layer 353 include a polyimide resin, an acrylic resin, an epoxy resin, a polyamide resin, a polyimide-amide resin, a siloxane resin, a benzocyclobutene-based resin, and a phenol resin.

Examples of the inorganic material that can be used for the separation layer 353 include metal, an alloy, and a compound, which include an element selected from tungsten, molybdenum, titanium, tantalum, niobium, nickel, cobalt, zirconium, zinc, ruthenium, rhodium, palladium, osmium, iridium, and silicon. A crystal structure of a layer containing silicon may be any of amorphous, microcrystal, or polycrystal.

The substrate 351 may be separated by irradiating a separation interface with a laser. As the laser, an excimer laser, a solid laser, and the like can be used. For example, a diode-pumped solid-state laser (DPSS) may be used. Alternatively, the substrate 351 may be separated by applying a perpendicular tensile force.

Note that the separation interface may be changed depending on the combination of materials of the substrate 351, the separation layer 353, and the insulating layer 367. For example, the interface between the substrate 351 and the separation layer 353, the inside of the separation layer 353, and the interface between the separation layer 353 and the insulating layer 367 can be the separation interface.

[Structure Example C of Display Device]

Figure 3A:
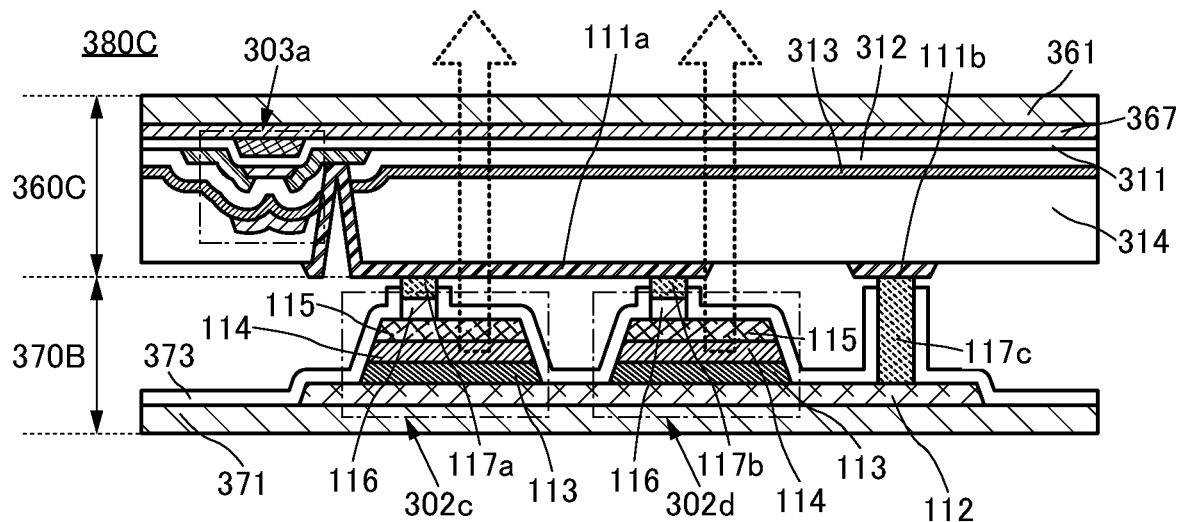

FIG. 3(A) illustrates a cross-sectional view of a display device 380C.

The display device 380C has a structure in which a circuit board 360C and an LED substrate 370B are attached to each other. In the display device 380C, two light-emitting diodes are electrically connected to one transistor. As described above, a plurality of light-emitting diodes may be electrically connected to one transistor.

Figure 3B:
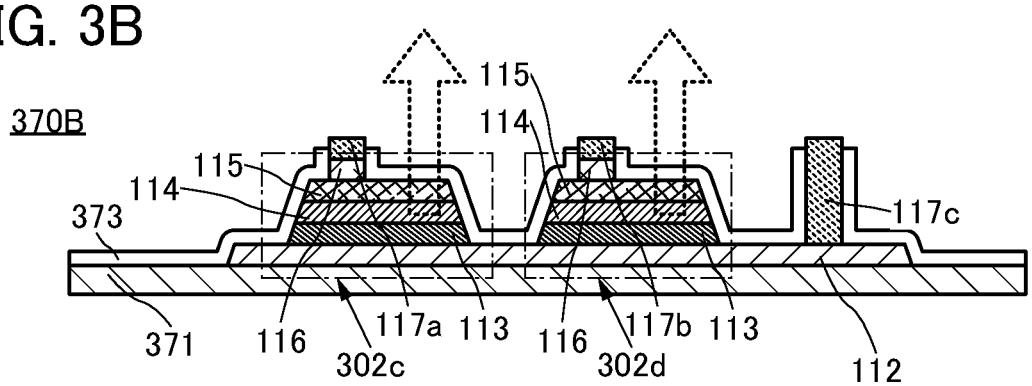
FIG. 3(B) is a cross-sectional view illustrating a structure example of an LED substrate.

FIG. 3(B) illustrates a cross-sectional view of the LED substrate 370B.

The LED substrate 370B includes the substrate 371, a light-emitting diode 302c, a light-emitting diode 302d, the conductor 117a, the conductor 117b, the conductor 117c, and the protective layer 373.

The light-emitting diodes 302c and 302d have the same structure and each include an electrode 112, a semiconductor layer 113, a light-emitting layer 114, a semiconductor layer 115, and an electrode 116.

The electrode 112 is electrically connected to the semiconductor layer 113 and the conductor 117c. The electrode 116 is electrically connected to the semiconductor layer 115 and the conductor 117a or 117b. The protective layer 373 is provided to cover the substrate 371, the electrode 112, the semiconductor layer 113, the light-emitting layer 114, the semiconductor layer 115, and the electrode 116. The protective layer 373 covers the side surfaces of the conductors 117a to 117c and includes openings overlapping with the top surfaces of the conductors 117a to 117c. In the openings, the top surfaces of the conductors 117a to 117c are exposed.

The light-emitting layer 114 is a light-emitting layer, and one of the semiconductor layer 113 and the semiconductor layer 115 is an n-type semiconductor layer and the other is a p-type semiconductor layer. The light-emitting diodes 302c and 302d are formed to emit light of the same color.

Figure 3C:
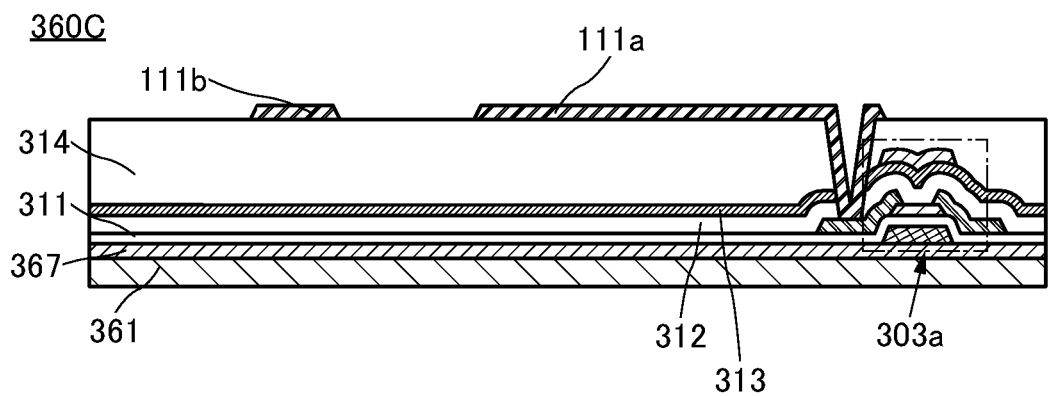
FIG. 3(C) is a cross-sectional view illustrating a structure example of a circuit board.

FIG. 3(C) illustrates a cross-sectional view of the circuit board 360C.

The circuit board 360C includes the substrate 361, the insulating layer 367, the transistor 303a, the insulating layer 314, the conductive layer 111a, and the conductive layer 111b.

As illustrated in FIG. 3(A), the conductors 117a and 117b provided in the LED substrate 370B are connected to the conductive layer 111a provided in the circuit board 360C. Thus, the transistor 303a and the light-emitting diodes 302c and 302d can be electrically connected to each other. The electrode 116 functions as a pixel electrode of the light-emitting diodes 302a and 302b. Furthermore, the conductor 117c provided in the LED substrate 370B and the conductive layer 111b provided in the circuit board 360C are connected to each other. The electrode 112 functions as a common electrode of the light-emitting diodes 302c and 302d. Although a common electrode is provided in each of the light-emitting diodes in the LED substrate 370A (FIG. 1(B)), a common electrode (the electrode 112) may be provided for the plurality of light-emitting diodes as illustrated in the LED substrate 370B.

[Structure Examples D, E, and F of Display Device]

Figure 4A:
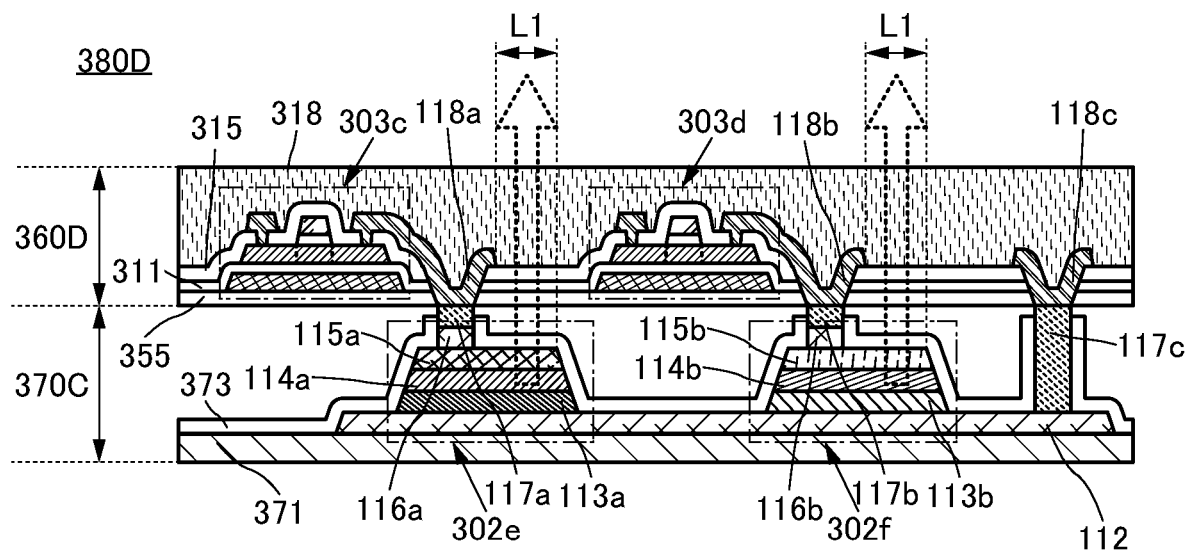

FIG. 4(A) illustrates a cross-sectional view of a display device 380D.

The display device 380D has a structure in which a circuit array 360D and an LED substrate 370C are attached to each other. As described later, the circuit array 360D is formed over a substrate with a separation layer therebetween. Then, a surface of the circuit array 360D exposed by separation of the substrate is attached to the LED substrate 370C.

Figure 4B:
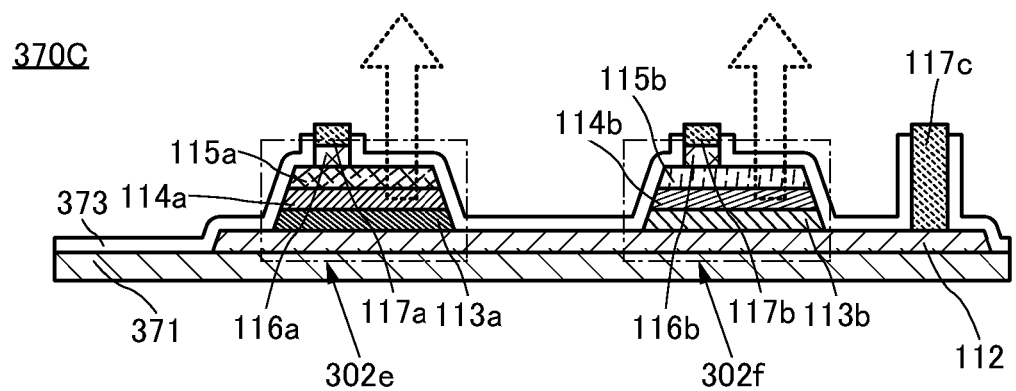
FIG. 4(B) is a cross-sectional view illustrating a structure example of an LED substrate.

FIG. 4(B) illustrates a cross-sectional view of the LED substrate 370C.

The LED substrate 370C includes the substrate 371, a light-emitting diode 302e, a light-emitting diode 302f, the conductor 117a, the conductor 117b, the conductor 117c, and the protective layer 373.

The light-emitting diode 302e includes the electrode 112, the semiconductor layer 113a, the light-emitting layer 114a, the semiconductor layer 115a, and the electrode 116a. The light-emitting diode 302f includes the electrode 112, the semiconductor layer 113b, the light-emitting layer 114b, the semiconductor layer 115b, and the electrode 116b.

The electrode 112 is electrically connected to the semiconductor layers 113a and 113b and the conductor 117c. The electrode 116a is electrically connected to the semiconductor layer 115a and the conductor 117a. The electrode 116b is electrically connected to the semiconductor layer 115b and the conductor 117c. The protective layer 373 is provided to cover the substrate 371, the electrode 112, the semiconductor layers 113a and 113b, the light-emitting layers 114a and 114b, the semiconductor layers 115a and 115b, and the electrodes 116a and 116b. The protective layer 373 covers the side surfaces of the conductors 117a to 117d and includes the openings overlapping with the top surfaces of the conductors 117a to 117d. In the openings, the top surfaces of the conductors 117a to 117d are exposed.

A method for fabricating the circuit array 360D is described with reference to FIG. 5(A) and FIG. 5(B).

Figure 5A:
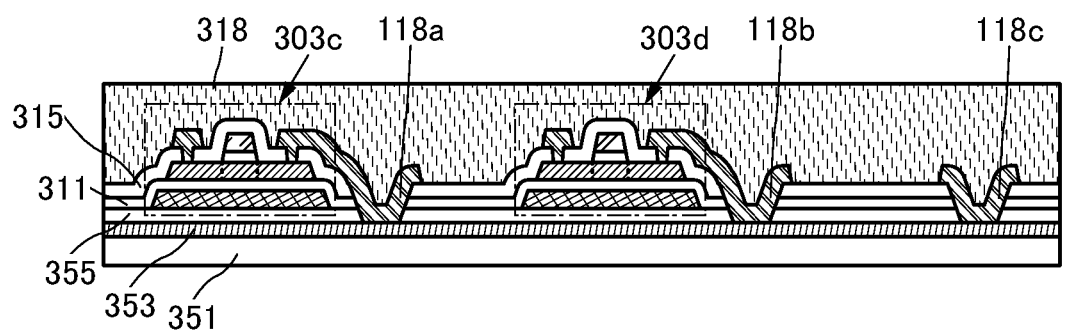

As illustrated in FIG. 5(A), the separation layer 353 is formed over the substrate 351, and an insulating layer 355 is formed over the separation layer 353. Then, an opening is formed in part of the insulating layer 355. Next, the transistors 303c and 303d and a conductive layer 118c are formed over the insulating layer 355. Then, the transistors 303c and 303d, the conductive layer 118c, and the like are sealed with a sealing layer 318.

The transistors 303c and 303d each include a back gate, the gate insulating layer 311, a semiconductor layer, a gate insulating layer, a gate, an insulating layer 315, a source, and a drain. The semiconductor layer includes a channel formation region and a pair of low-resistance regions. The back gate (the lower gate) and the channel formation region overlap with each other with the gate insulating layer 311 therebetween. The gate (the upper gate) and the channel formation region overlap with each other with the gate insulating layer therebetween. The source and the drain are each electrically connected to the low-resistance regions through openings provided in the insulating layer 315. The conductive layers 118a and 118b each functioning as the source or the drain are in contact with the separation layer 353 through openings provided in the insulating layer 355. The conductive layer 118c fabricated using the same material and the same step as the conductive layers 118a and 118b is in contact with the separation layer 353 through an opening provided in the insulating layer 355.

For the sealing layer 318, one or both of an inorganic insulating material and an organic insulating material can be used. Examples of the material of the sealing layer 318 include resin that can be used for an adhesive layer, an inorganic insulating film with a high barrier property, and a flexible resin film.

Figure 5B:
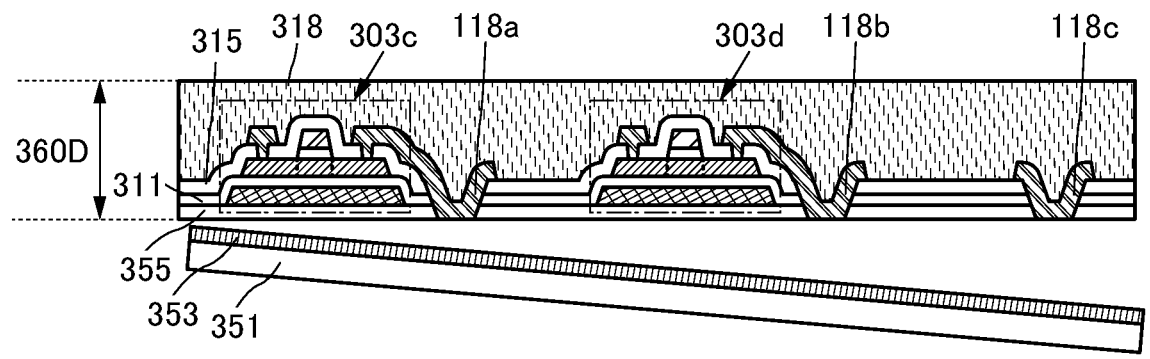

Next, as illustrated in FIG. 5(B), the substrate 351 is separated with the use of the separation layer 353. FIG. 5(B) illustrates an example in which the conductive layers 118a, 118b, and 118c are exposed by the separation. In the case where the separation layer 353 remains after the separation of the substrate 351, the separation layer 353 is removed to expose the conductive layers 118a, 118b, and 118c. Thus, the circuit array 360D can be formed.

Then, the circuit array 360D and the LED substrate 370C are attached to each other, whereby the display device 380D illustrated in FIG. 4(A) can be fabricated.

As illustrated in FIG. 4(A), the conductor 117a provided in the LED substrate 370C is connected to the conductive layer 118a provided in the circuit array 360D. Thus, a transistor 303e and the light-emitting diode 302e can be electrically connected to each other. The electrode 116a functions as a pixel electrode of the light-emitting diode 302e.

In a similar manner, the conductor 117b provided in the LED substrate 370C is connected to the conductive layer 118b provided in the circuit array 360D. Thus, a transistor 303f and the light-emitting diode 302f can be electrically connected to each other. The electrode 116b functions as a pixel electrode of the light-emitting diode 302f.

Furthermore, a conductor 117c provided in an LED substrate 370D and a conductive layer 118c provided in the circuit array 360D are connected to each other. The electrode 112 functions as a common electrode of the light-emitting diodes 302e and 302f.

Light emitted from the light-emitting diodes 302e and 302f is extracted to the sealing layer 318 side. The sealing layer 318, the insulating layer 355, the gate insulating layer 311, and the insulating layer 315 each transmit the light. Furthermore, a conductive material transmitting visible light is preferably used for the conductive layers 118a and 118b because a light-emitting region can be larger than a light-emitting region L1 illustrated in FIG. 4(A).

Figure 6:
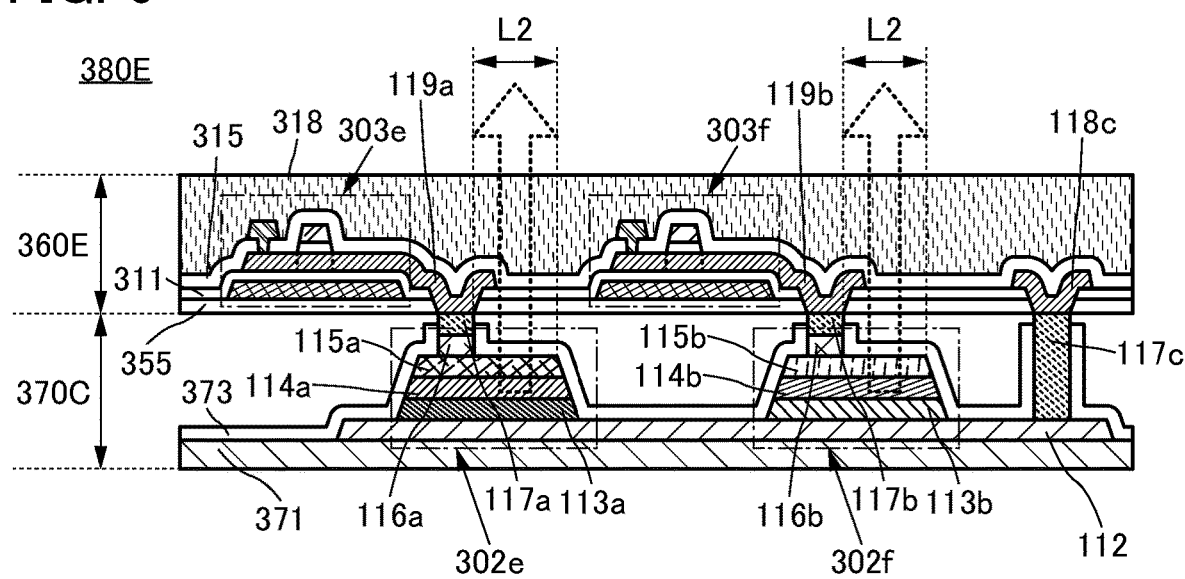
FIG. 6 A cross-sectional view illustrating a structure example of a display device.

Further, as in a display device 380E illustrated in FIG. 6, low-resistance regions 119a and 119b of a semiconductor layer may be connected to the conductors 117a and 117b through the openings provided in the insulating layer 355. In the case where an oxide semiconductor is used for the semiconductor layer, the low-resistance regions 119a and 119b of the semiconductor layer can transmit light emitted from the light-emitting diodes; thus, a light-emitting region L2 can be larger than the light-emitting region L1.

Figure 7:
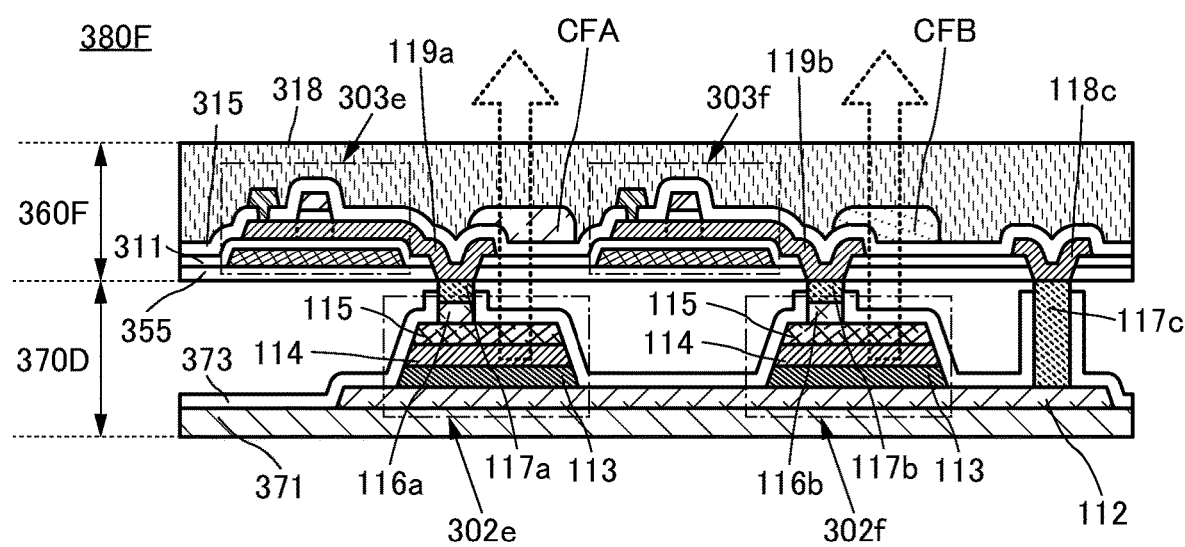
FIG. 7 A cross-sectional view illustrating a structure example of a display device.

Alternatively, as in a display device 380F illustrated in FIG. 7, the display device may be fabricated in such a manner that the LED substrate 370D in which the light-emitting diodes emitting light of the same color (e.g., white) are arranged in a matrix and a circuit array 360F including coloring layers (coloring layers CFA and CFB) are attached to each other. The light-emitting diode 302e and the light-emitting diode 302f emit light of the same color. Light emitted from the light-emitting diode 302e is extracted to the outside of the display device 380F through the coloring layer CFA. Light emitted from the light-emitting diode 302f is extracted to the outside of the display device 380F through the coloring layer CFB whose color is different from that of the coloring layer CFA. With the provision of coloring layers of, for example, red, green, and blue in the circuit array 360F, a display device capable of full-color display can be fabricated.

Note that each of the display devices 380E and 380F can be fabricated by changing the circuit array 360D, which is formed over the substrate 351 with the separation layer 353 therebetween in the method for fabricating the display device 380D, to a circuit array 360E or the circuit array 360F.

[Transistor]

Next, a transistor that can be used in the display device is described.

There is no particular limitation on a structure of the transistor included in the display device. For example, a planar transistor may be employed, a staggered transistor may be employed, or an inverted staggered transistor may be employed. The transistor structure may be either a top-gate structure or a bottom-gate structure. Alternatively, a gate electrode may be provided above and below a channel.

As the transistor included in the display device, a transistor using a metal oxide in a channel formation region can be used, for example. Therefore, a transistor with an extremely low off-state current can be achieved.

Alternatively, a transistor containing silicon in a channel formation region may be used as the transistor included in the display device. Examples of the transistor include a transistor containing amorphous silicon, a transistor containing crystalline silicon (typically, low-temperature polysilicon), and a transistor containing single crystal silicon.

Figure 8A:
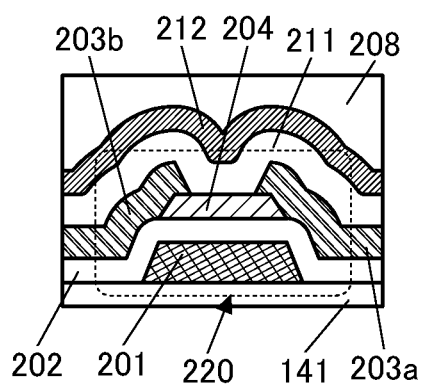
Figure 8B:
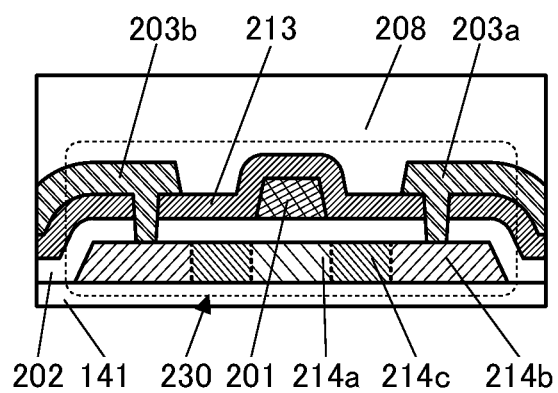

FIG. 8(A) and FIG. 8(B) each illustrate a structure example of a transistor. Each transistor is provided between an insulating layer 141 and an insulating layer 208. The insulating layer 141 preferably has a function of a base film. The insulating layer 208 preferably has a function of a planarization film.

A transistor 220 illustrated in FIG. 8(A) is a transistor having a bottom-gate structure, which includes a metal oxide in a semiconductor layer 204. The metal oxide can function as an oxide semiconductor.

An oxide semiconductor is preferably used as a semiconductor of the transistor. Using a semiconductor material having a wider band gap and a lower carrier density than silicon is preferable because an off-state current of the transistor can be reduced.

The transistor 220 includes a conductive layer 201, an insulating layer 202, a conductive layer 203a, a conductive layer 203b, and the semiconductor layer 204. The conductive layer 201 functions as a gate. The insulating layer 202 functions as a gate insulating layer. The semiconductor layer 204 overlaps with the conductive layer 201 with the insulating layer 202 therebetween. The conductive layer 203a and the conductive layer 203b are each electrically connected to the semiconductor layer 204. The transistor 220 is preferably covered with an insulating layer 211 and an insulating layer 212. Any of a variety of inorganic insulating films can be used as the insulating layer 211 and the insulating layer 212. In particular, an oxide insulating film is suitable for the insulating layer 211, and a nitride insulating film is suitable for the insulating layer 212.

A transistor 230 illustrated in FIG. 8(B) is a transistor having a top-gate structure, which includes polysilicon in a semiconductor layer.

The transistor 230 includes the conductive layer 201, the insulating layer 202, the conductive layer 203a, the conductive layer 203b, the semiconductor layer, and an insulating layer 213. The conductive layer 201 functions as a gate. The insulating layer 202 functions as a gate insulating layer. The semiconductor layer includes a channel formation region 214a and a pair of low-resistance regions 214b. The semiconductor layer may further include an LDD (Lightly Doped Drain) region. In FIG. 8(B), an example in which an LDD region 214c is provided between the channel formation region 214a and the low-resistance region 214b is shown. The channel formation region 214a overlaps with the conductive layer 201 with the insulating layer 202 therebetween. The conductive layer 203a is electrically connected to one of the pair of low-resistance regions 214b through an opening provided in the insulating layer 202 and the insulating layer 213. In a similar manner, the conductive layer 203b is electrically connected to the other of the pair of low-resistance regions 214b. Any of a variety of inorganic insulating films can be used as the insulating layer 213. In particular, a nitride insulating film is suitable for the insulating layer 213.

[Metal Oxide]

A metal oxide functioning as an oxide semiconductor is preferably used for the semiconductor layer. A metal oxide that can be used for the semiconductor layer will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) or CAC (Cloud-Aligned Composite) might be stated. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a light-emitting layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M in the (M, Zn) layer is replaced with indium, the layer can also be referred to as an (In, M, Zn) layer. Furthermore, when indium in the In layer is replaced with the element M, the layer can be referred to as an (In, M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters) in some cases.

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The metal oxide film can be formed by a sputtering method. Alternatively, a PLD method, a PECVD method, a thermal CVD method, an ALD method, a vacuum evaporation method, or the like may be used.

Note that examples of a material that can be used for any of a variety of conductive layers forming the display device include metals such as aluminum, titanium, chromium, nickel, copper, yttrium, zirconium, molybdenum, silver, tantalum, or tungsten or an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Furthermore, copper containing manganese is preferably used because it increases controllability of a shape by etching.

Note that examples of a material that can be used for any of a variety of insulating layers forming the display device include a resin such as acrylic, polyimide, epoxy, and silicone, and an inorganic insulating material such as silicon oxide, silicon oxynitride, silicon nitride oxide, silicon nitride, or aluminum oxide.

As described above, in the display device of this embodiment, a plurality of light-emitting diodes and a plurality of transistors can be attached to each other at a time, which can lead to a reduction in manufacturing cost of the display device and an improvement in yield. Moreover, by combining a micro LED and a transistor using a metal oxide, a display device with reduced power consumption can be achieved.

This embodiment can be combined with the other embodiments as appropriate. In this specification, in the case where a plurality of structure examples are shown in one embodiment, the structure examples can be combined as appropriate.

Embodiment 2

In this embodiment, electronic devices of embodiments of the present invention are described with reference to FIG. 9 to FIG. 11.

The electronic device in this embodiment includes the display device of one embodiment of the present invention in its display portion. The display device of one embodiment of the present invention has high display quality and low power consumption. In addition, the display device of one embodiment of the present invention can be easily increased in resolution and size. Thus, the display device of one embodiment of the present invention can be used for a display portion of a variety of electronic devices.

The display portion of the electronic device in this embodiment can display a video with definition of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, or the like on the display portion. When the electronic device includes the antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 9A:
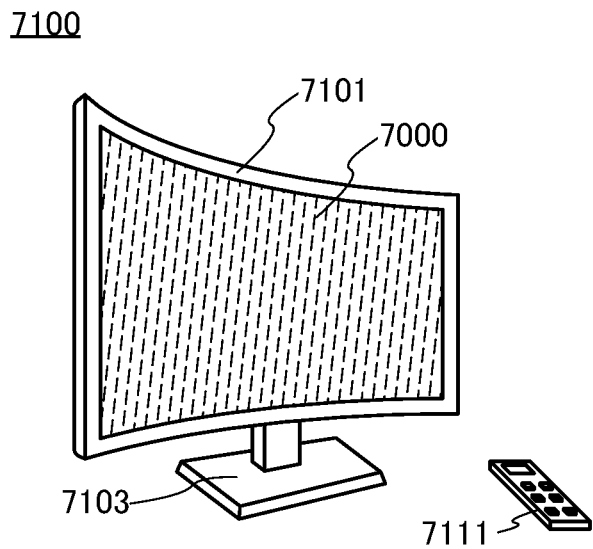

FIG. 9(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used for the display portion 7000.

Operation of the television device 7100 illustrated in FIG. 9(A) can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 9B:
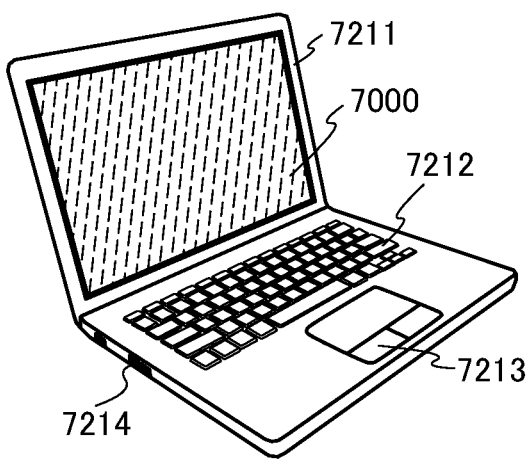

FIG. 9(B) illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used for the display portion 7000.

Figure 9C:
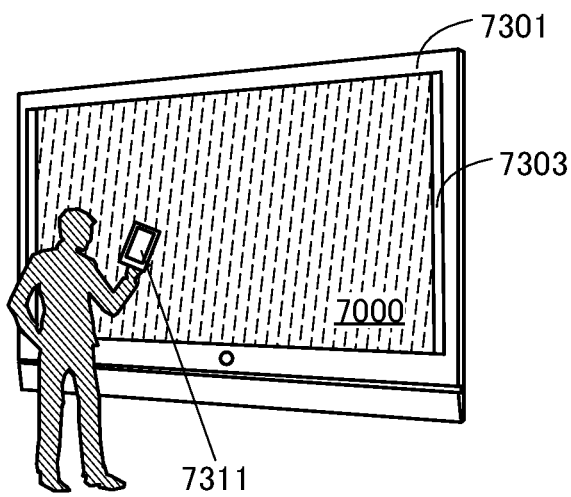
Figure 9D:
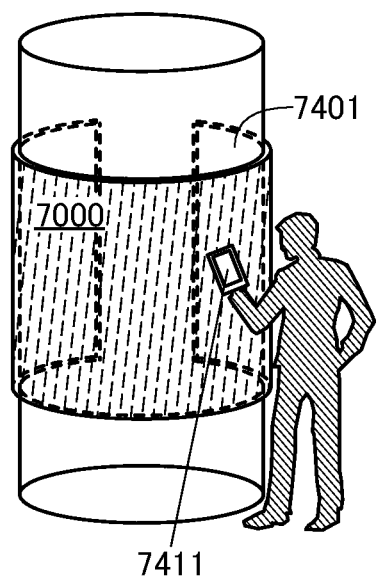

FIG. 9(C) and FIG. 9(D) illustrate examples of digital signage.

Digital signage 7300 illustrated in FIG. 9(C) includes a housing 7301, the display portion 7000, a speaker 7303, and the like. Furthermore, the digital signage can include an LED lamp, operation keys (including a power switch or an operation switch), a connection terminal, any of a variety of sensors, a microphone, and the like.

FIG. 9(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 9(C) and FIG. 9(D).

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of an image or a moving image on the display portion 7000, intuitive operation by a user is possible. Moreover, for an application for providing information such as route information or traffic information, usability can be enhanced by intuitive operation.

Furthermore, as illustrated in FIG. 9(C) and FIG. 9(D), it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 10A:
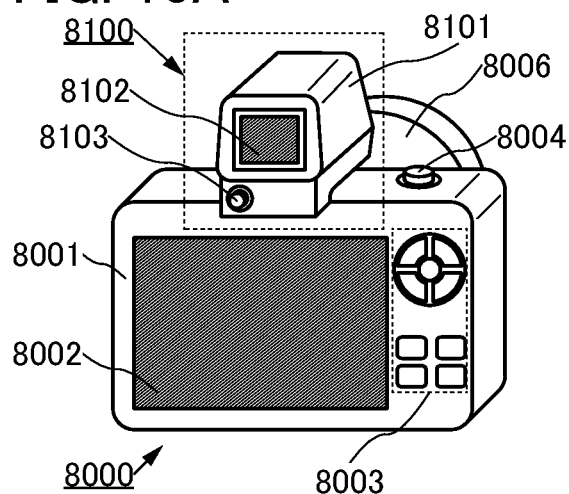

FIG. 10(A) is an external view of a camera 8000 to which a finder 8100 is attached.

The camera 8000 includes a housing 8001, a display portion 8002, operation buttons 8003, a shutter button 8004, and the like. Moreover, a detachable lens 8006 is attached to the camera 8000. Note that the lens 8006 and the housing may be integrated with each other in the camera 8000.

The camera 8000 can take images by the press of the shutter button 8004 or touch on the display portion 8002 functioning as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video and the like received from the camera 8000 on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

Figure 10B:
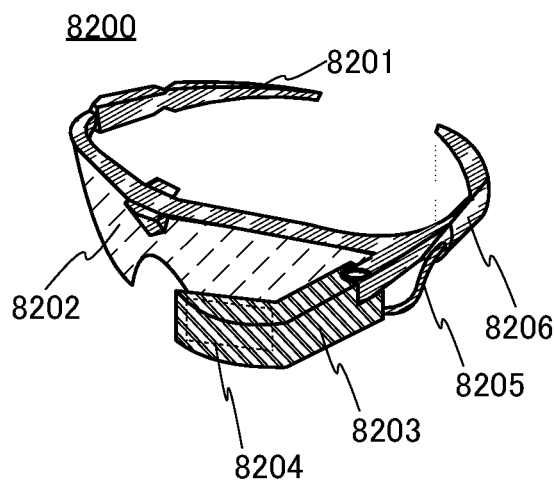

FIG. 10(B) is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and data on the movement of the user's eyeball and eyelid can be used as an input means.

In addition, the mounting portion 8201 may be provided with a plurality of electrodes capable of sensing current flowing in response to the movement of the user's eyeball in a position in contact with the user to have a function of recognizing the user's sight line. A function of monitoring the user's pulse with the use of current flowing through the electrodes may be provided. The mounting portion 8201 may include any of a variety of sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used for the display portion 8204.

Figure 10C:
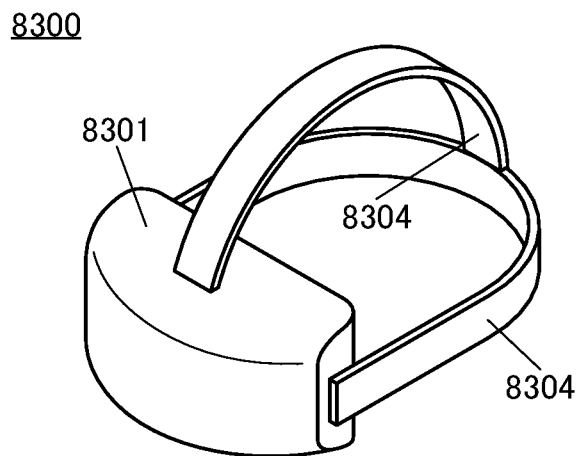
Figure 10D:
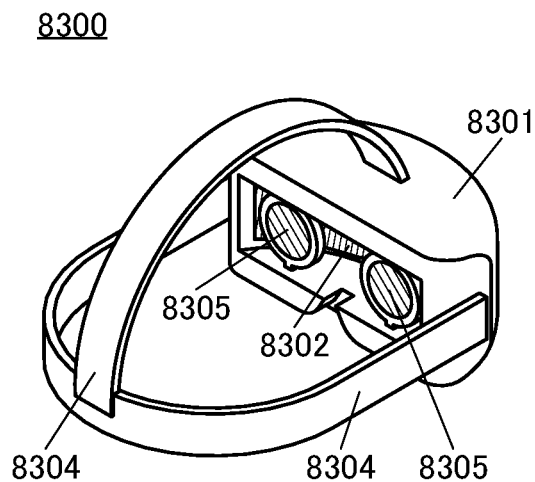
Figure 10E:
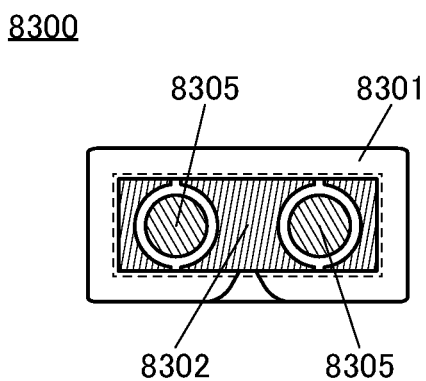

FIG. 10(C), FIG. 10(D), and FIG. 10(E) are external views of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed because the user can feel a high realistic sensation. When another image displayed in a different region of the display portion 8302 is seen through the lenses 8305, three-dimensional display using parallax or the like can also be performed. Note that the structure is not limited to that in which one display portion 8302 is provided, and two display portions 8302 may be provided so that one display portion is provided for one eye of the user.

The display device of one embodiment of the present invention can be used for the display portion 8302. The display device of one embodiment of the present invention has extremely high resolution; thus, pixels are not easily seen by the user even when the user sees a magnified display by the use of the lenses 8305 as in FIG. 10(E). In other words, a video with a strong sense of reality can be seen by the user with the use of the display portion 8302.

Electronic devices illustrated in FIG. 11(A) to FIG. 11(F) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 11(A) to FIG. 11(F) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIG. 11(A) to FIG. 11(F) will be described in detail below.

Figure 11A:
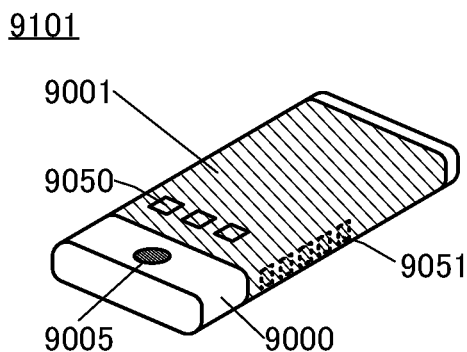

FIG. 11(A) is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 11(A) shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 11B:
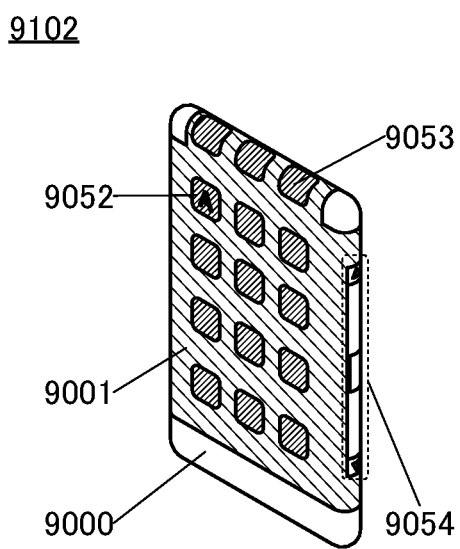

FIG. 11(B) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 11C:
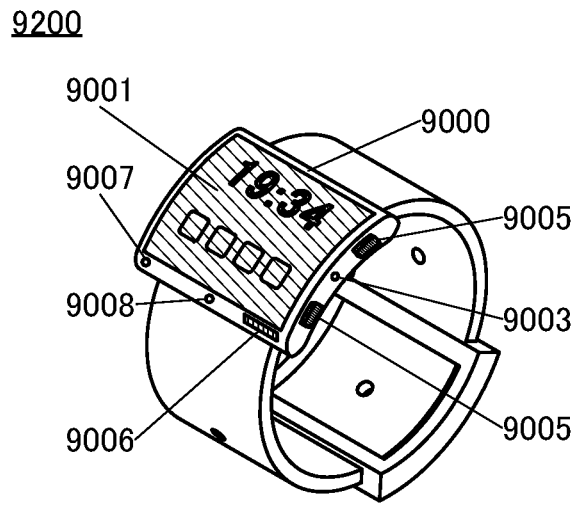

FIG. 11(C) is a perspective view illustrating a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 11D:
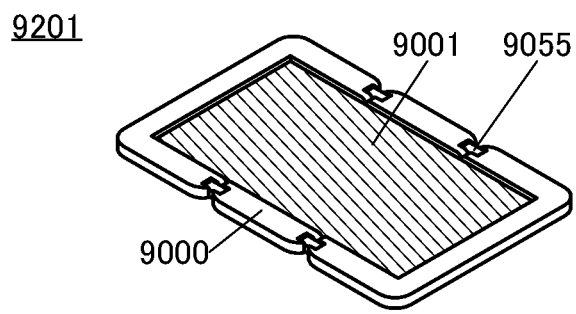
Figure 11E:
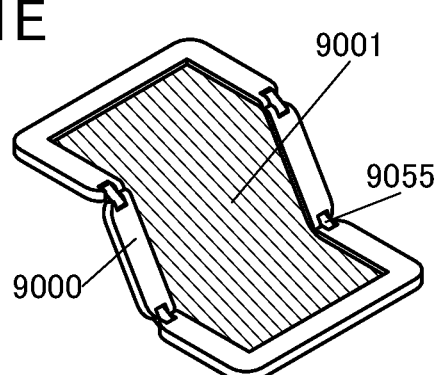
Figure 11F:
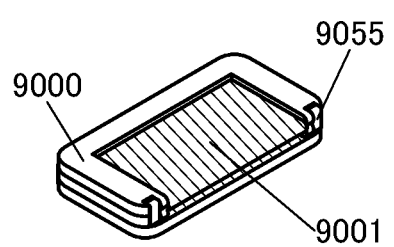

FIG. 11(D), FIG. 11(E), and FIG. 11(F) are perspective views showing a foldable portable information terminal 9201. FIG. 11(D) is a perspective view of an opened state of the portable information terminal 9201, FIG. 11(F) is a perspective view of a folded state thereof, and FIG. 11(E) is a perspective view of a state in the middle of change from one of FIG. 11(D) and FIG. 11(F) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments and the example as appropriate.

REFERENCE NUMERALS

111a: conductive layer, 111b: conductive layer, 111c: conductive layer, 111d: conductive layer, 112: electrode, 112a: electrode, 112b: electrode, 113: semiconductor layer, 113a: semiconductor layer, 113b: semiconductor layer, 114: light-emitting layer, 114a: light-emitting layer, 114b: light-emitting layer, 115: semiconductor layer, 115a: semiconductor layer, 115b: semiconductor layer, 116: electrode, 116a: electrode, 116b: electrode, 117a: conductor, 117b: conductor, 117c: conductor, 117d: conductor, 118a: conductive layer, 118b: conductive layer, 118c: conductive layer, 119a: low-resistance region, 119b: low-resistance region, 141: insulating layer, 201: conductive layer, 202: insulating layer, 203a: conductive layer, 203b: conductive layer, 204: semiconductor layer, 208: insulating layer, 211: insulating layer, 212: insulating layer, 213: insulating layer, 214a: channel formation region, 214b: low-resistance region, 214c: LDD region, 220: transistor, 230: transistor, 302a: light-emitting diode, 302b: light-emitting diode, 302c: light-emitting diode, 302d: light-emitting diode, 302e: light-emitting diode, 302f: light-emitting diode, 303a: transistor, 303b: transistor, 303c: transistor, 303d: transistor, 303e: transistor, 303f: transistor, 311: gate insulating layer, 312: insulating layer, 313: insulating layer, 314: insulating layer, 315: insulating layer, 318: sealing layer, 351: substrate, 353: separation layer, 355: insulating layer, 360A: circuit board, 360B: circuit board, 360C: circuit board, 360D: circuit array, 360E: circuit array, 360F: circuit array, 361: substrate, 362: substrate, 363: adhesive layer, 367: insulating layer, 370A: LED substrate, 370B: LED substrate, 370C: LED substrate, 370D: LED substrate, 371: substrate, 373: protective layer, 380A: display device, 380B: display device, 380C: display device, 380D: display device, 380E: display device, 380F: display device, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising a substrate, a plurality of transistors, and a plurality of light-emitting diodes,
    wherein the plurality of light-emitting diodes are provided in a matrix over the substrate,
    wherein each of the plurality of light-emitting diodes includes a first semiconductor layer in direct contact with the substrate, a light-emitting layer over the first semiconductor layer, and a second semiconductor layer over the light-emitting layer,
    wherein each of the plurality of transistors is electrically connected to at least one of the plurality of light-emitting diodes,
    wherein the plurality of light-emitting diodes are positioned closer to the substrate than the plurality of transistors are, and
    wherein the plurality of light-emitting diodes emit light to an opposite side of the substrate.

2. The display device according to claim 1,
    wherein at least one of the plurality of light-emitting diodes is a micro light-emitting diode.

3. The display device according to claim 1,
    wherein at least one of the plurality of transistors comprises a metal oxide in a channel formation region.

4. The display device according to claim 1,
    wherein the plurality of light-emitting diodes comprise a first light-emitting diode and a second light-emitting diode, and
    wherein the first light-emitting diode and the second light-emitting diode emit light of different colors.

5. The display device according to claim 1,
    wherein the plurality of light-emitting diodes comprise a light-emitting diode emitting white light.

6. A display module comprising the display device according to claim 1 and a connector or an integrated circuit.

7. An electronic device comprising:
    the display module according to claim 6; and
    at least one of an antenna, a battery, a housing, a camera, a speaker, a microphone, and an operation button.

8. A display device comprising a substrate, a plurality of transistors, and a plurality of light-emitting diodes,
    wherein the plurality of light-emitting diodes are provided in a matrix over the substrate,
    wherein each of the plurality of light-emitting diodes includes a first semiconductor layer in direct contact with the substrate, a light-emitting layer over the first semiconductor layer, and a second semiconductor layer over the light-emitting layer,
    wherein each of the plurality of transistors is electrically connected to at least one of the plurality of light-emitting diodes, and
    wherein the plurality of light-emitting diodes are positioned closer to the substrate than the plurality of transistors are.

9. The display device according to claim 8,
    wherein at least one of the plurality of light-emitting diodes is a micro light-emitting diode.

10. The display device according to claim 8,
    wherein at least one of the plurality of transistors comprises a metal oxide in a channel formation region.

11. The display device according to claim 8,
    wherein the plurality of light-emitting diodes comprise a first light-emitting diode and a second light-emitting diode, and
    wherein the first light-emitting diode and the second light-emitting diode emit light of different colors.

12. The display device according to claim 8,
wherein the plurality of light-emitting diodes comprise a light-emitting diode emitting white light.

13. A display module comprising the display device according to claim 8 and a connector or an integrated circuit.

14. An electronic device comprising:
the display module according to claim 13; and
at least one of an antenna, a battery, a housing, a camera, a speaker, a microphone, and an operation button.

* * * * *